(12) United States Patent
Sun et al.

(10) Patent No.: US 6,509,228 B1
(45) Date of Patent: Jan. 21, 2003

(54) ETCHING PROCEDURE FOR FLOATING GATE FORMATION OF A FLASH MEMORY DEVICE

(75) Inventors: Gow-Wei Sun, Kaohsiung (TW); Yann-Pyng Wu, Hsin-Chuang (TW)

(73) Assignee: United Microelectronics Corp. (TW)

( * ) Notice: Subject to any disclaimer, the term of this patent is extended or adjusted under 35 U.S.C. 154(b) by 111 days.

(21) Appl. No.: 09/650,911

(22) Filed: Aug. 29, 2000

(51) Int. Cl.$^7$ .......................... H01L 21/336
(52) U.S. Cl. ................ 438/257; 438/261; 438/266; 438/267; 438/593; 438/260; 438/264
(58) Field of Search ................ 438/257, 261, 438/266, 267, 216, 287, 591, 593, 773, 785, 258–260, 264, 594, 682

(56) References Cited

U.S. PATENT DOCUMENTS 5,767,018 A * 6/1998 Bell ........................ 438/696
6,066,567 A * 5/2000 En et al. .................. 438/706

* cited by examiner

*Primary Examiner*—Matthew Smith
*Assistant Examiner*—Igwe U. Anya
(74) *Attorney, Agent, or Firm*—Powell Goldstein Frazer & Murphy LLP

(57) ABSTRACT

A method of forming floating gates for flash memory is disclosed to improve contact properties with erase gates. The method includes formation of a tunnel oxide layer, a polysilicon layer and an interpoly insulating layer. These layers are patterned in two dry etching steps to complete floating gate definition. In the first etching step, the interpoly insulating layer is etched open in an oxide chamber to form a taper opening. The taper opening is further deepened in the second etching step, in which the polysilicon layer and the tunnel oxide layer are etched open in sequence in a poly chamber. A contact with smooth, vertical surface profile is thus formed in the second etching step. The two-step dry etching procedure is found to provide good contact profile for the floating gate to facilitate subsequent oxide deposition and contact filling. The proposed etching procedure also makes substantial operation reduction for floating gate formation and thus advantageously costs down for flash memory production.

23 Claims, 5 Drawing Sheets

ETCHING PROCEDURE FOR FLOATING GATE FORMATION OF A FLASH MEMORY DEVICE

BACKGROUND OF THE INVENTION

1. Field of the Invention

The present invention generally relates to fabrication of flash memory devices, and more particularly to a method for forming floating gates of the flash memory exhibiting improved contact reliability.

2. Description of the Prior Art

Field effect transistors having floating (unconnected) gates have long been utilized to form a non-volatile, semiconductor memory. Electrons are moved onto or removed from the floating gate of a given transistor memory cell in order to program or erase its state. The state of such a transistor memory cell is determined by applying a voltage across its source and drain and then measuring the current which passes through the transistor. The programmed level of charge on the floating gate is retained for a long period of time, essentially indefinitely. Memory arrays of such transistor cells are commonly available in various forms, such as PROMs, EPROMS, EEPROMs and flash EEPROMs. Currently, flash EEPROM technology is being used for large capacity semiconductor non-volatile memory, either in place of, or in combination with, a magnetic disk drive memory system.

Typically, such a semiconductor memory system is made up of a number of integrated circuit chips that each contain a two dimensional array of EEPROM cells, plus other integrated circuit chips providing a controller and other system operating support. One type of memory array integrated circuit chip includes elongated, spaced apart source and drain regions formed in a surface of a semiconductor substrate. These source and drain regions form the bit lines of the memory. A two dimensional array of floating gates has each floating gate positioned in a channel region between adjacent source and drain regions. An elongated control gate is positioned over each row of floating gates in a direction transverse to the source and drain regions. The control gates are the word lines of the memory array.

One type of cell used in such a memory array extends each of its floating gates over only part of its channel between the source and drain regions, while the control gate is positioned over the remaining portion of the channel. This is termed a "split-channel" type of EEPROM cell and effectively connects a select transistor in series with the floating gate transistor in order to isolate the floating gate transistor from the bit lines when its control gate (word line) is not active. An alternative type of EEPROM cell extends its control gate completely across the channel region, thus eliminating the select transistor and allowing the memory cell to be made smaller. However, the absence of the select transistor in each cell places additional constraints on operating a memory array of such cells.

One class of EEPROM devices employs an erase gate positioned adjacent the floating gate of each cell, with a thin dielectric therebetween, in order to transfer electrons from the floating gate to the erase gate when all the relative voltages are appropriately set. Flash EEPROM systems use a common erase gate for a sector or other block of cells, thus enabling their simultaneous erasure in a "flash." An alternative class of EEPROM devices does not use the separate erase gate, but rather removes the electrons from the floating gate through the substrate when all the appropriate voltages are set. In such flash EEPROM systems, the sectors or other blocks of cells are isolated from one another on the substrate in order that the individual blocks may be selectively and individually erased.

Since a high density memory cell array is always desired, self-aligned techniques are used during manufacture of the circuit whenever possible. One way of forming an array with erase gates is to deposit the erase gates in between adjacent rows of memory cells that have already been largely formed, and to couple each erase gate with the floating gates of the adjacent rows on both sides. FIG. 1 represents some relevant portions of a typical flash memory cell. The memory cell is formed on a semiconductor substrate 10. Elongated, parallel source and drain regions (not shown) are implanted into a surface of the substrate 10. Field oxide 20 has strips of doped polysilicon 30 (POLY 1) extending across them. These polysilicon strips are then separated into separate floating gates. A gate oxide layer 22 (commonly referred to as the tunnel oxide) formed on the surface of the substrate 10 to separate the resulting floating gates from their respective memory cell channel portions of the substrate 10. Doped polysilicon strips 40 (POLY 2) arranged orthogonally with the polysilicon strips 30, and also with the elongated source and drain regions, serve as control gates. An interpoly dielectric layer 32 overlies the floating gates 30 separates the control gates 40 from the floating gate 30. Oxide strips 42 are formed over the top surface of the control gates to provide appropriate gate isolation. The side walls of the floating gates and the control gates are covered with oxide layers 34 and 44 respectively to insulate the floating gates 30 and control gates 40 from another doped polysilicon strips 50 (POLY 3) that fills in the remaining space between the rows. The polysilicon strips 50 are formed into elongated erase gates and can be coupled through the tunnel dielectric 22 with the floating gates 30.

FIGS. 2A–2D shows process that is commonly used for forming the relevant portions of the floating gates 30 described above. Referring to FIG.2A, the gate oxide layer 22 is first thermally grown over the substrate 10. Next, the POLY 1 layer 30 is formed followed by the deposition of the interpoly dielectric layer 32. In order to define the floating gate structure and provide contact with the erase gates 50 of the memory, a vertical hole is etched through the interpoly dielectric 32, the POLY 1 layer 30 and half-way through the tunnel oxide 22. The etching generally takes place in a multi-chamber etch tool and achieved by performing layer etching in each layer's corresponding etch chamber. To remove the aforementioned interpoly dielectric 32, polysilicon 30 and gate oxide 22, the wafer is typically being transfered from one chamber to another. For example, the removal of the interpoly dielectric layer and the tunnel oxide layer is generally done by etching with a florinated chemistry such as $CF_4O_2$ in an oxide chamber while the etching of the POLY 1 layer applies etchant such as $HBrO_2$ in a poly chamber. The alternations of the chamber applications thus result in three separate etching steps (First etching the interpoly dielectric 32 in an oxide chamber as indicated in FIG.2B. Then etching the POLY 1 layer 30 in a poly chamber as indicated in FIG.2C. Finally, etching the oxide layer 22 in an oxide chamber as indicated in FIG.2D.) for conventional floating gate definition.

The etching steps for forming the aforementioned vertical hole are conventionally done by reactive ion etching (RIE), which is an anisotropic dry etching process that is capable of forming clean vertical holes with high aspect ratios. However, upon the chamber transferring procedure, it is observed that recess areas often occur, especially on the border portions of the exposed POLY 1 and tunnel oxide, such as recess 33 indicated in FIG.2D. This is mainly due to the divergent chamber conditions, especially the pressure variations, amongst different etch chamber tools. In particular, the oxide chambers are generally equipped with a much higher pressure surrounding than the poly chambers. When the POLY 1 etching has been completed and the wafer is transferred from the poly chamber to the oxide chamber for the tunnel oxide etching, the abrupt increased etching pressure in the oxide chamber may cause the frontal etching area to over-etch and result in a recess with tapered shape profile, such as the recess 33 in the figure. Since surface recess of the contact hole could cause oxide thinning effect upon the subsequent oxide 34 formation and thus degrade the reverse voltage between POLY 1 and POLY 3 gates, one would appreciate a smoother surface profile to improve the electrical properties of the flash memory.

SUMMARY OF THE INVENTION

In accordance with the present invention, a method is provided for forming floating gates that substantially improves contact properties with erase gates in a flash memory device.

It is an object of this invention to provide an etching procedure that improves sidewall profile of the floating gates to reduce oxide thinning effect of the floating gate surface.

It is a further object of this invention to simplify the etching procedure to cost down for the flash memory production.

It is another object of this invention to enhance oxide protecting strength of the floating gate surface by applying plasma nitridation treatment.

It is yet another object of this invention to provide improved contact structure to facilitate the erase gate layer filling.

In one embodiment, the present invention relates to a method of forming a flash memory device, involving the steps of forming a tunnel oxide on a substrate, forming a first polysilicon layer over the tunnel oxide, forming an insulating layer over the first polysilicon layer and forming a contact hole through the layers (the tunnel oxide, the first polysilicon and the insulating layers) by performing a two-step etching procedure. The etching procedure is executed in two etch chambers, including one oxide chamber and one poly chamber, by first etching the insulating layer in the oxide chamber (the first step) and subsequently etching the first polysilicon layer and the tunnel oxide layer in the poly chamber (the second step). The two-step etching procedure improves surface profile for the contact (as comparing to conventional three-step procedure). The provision of such improved surface condition would produce good oxide quality for the subsequent protecting oxide formation. The protecting oxide is formed after the etching procedure is completed to insulate the exposed first polysilicon in the contact area. The device structure now completely covering with oxide could then be treated with $NH_3/N_2$ plasma or with addition of rapid thermal annealing process to enhance the oxide quality.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

FIGS. 3A to 3D illustrate a process for fabricating a microelectronic structure in accordance with the present invention. A microelectronic structure which can be advantageously fabricated using the present method is a floating gate structure in a flash memory device. However, the invention is not limited to this or any other particular application, and can be used to fabricate any kind of suitable microelectronic structure.

Figure 1:
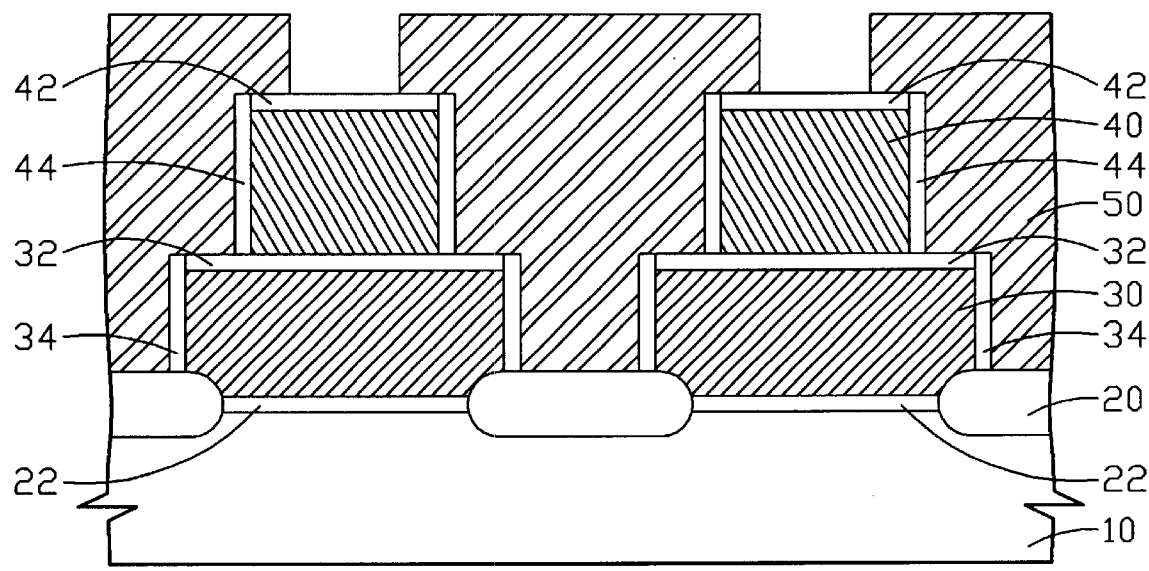
FIG. 1 is a side view of relevant portions of a conventional memory cell in a flash memory device.
Figure 2A:
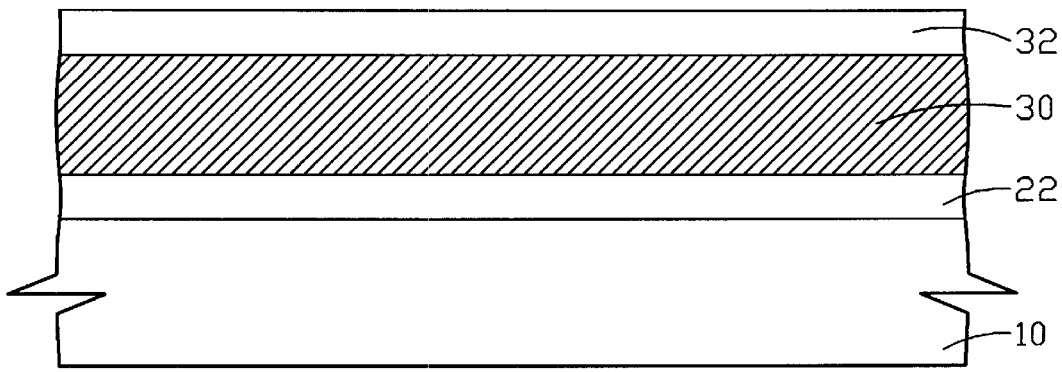
FIGS. 2A to 2D are cross-sectional views illustrating conventional three-step etching of floating gates.
Figure 2B:
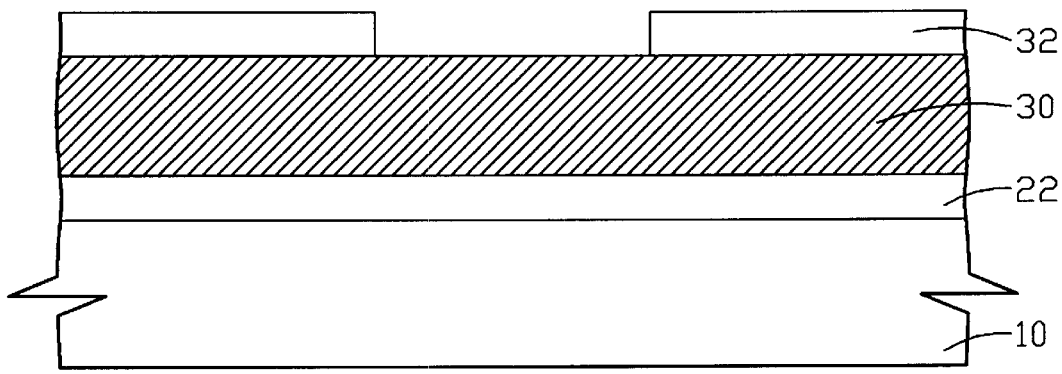
Figure 2C:
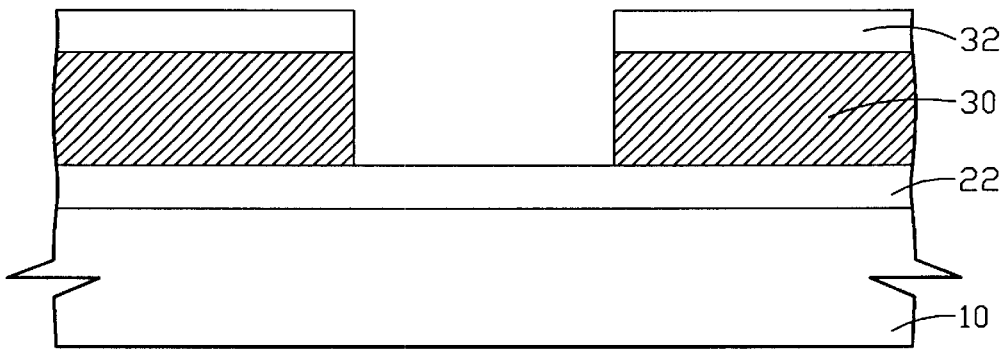
Figure 2D:
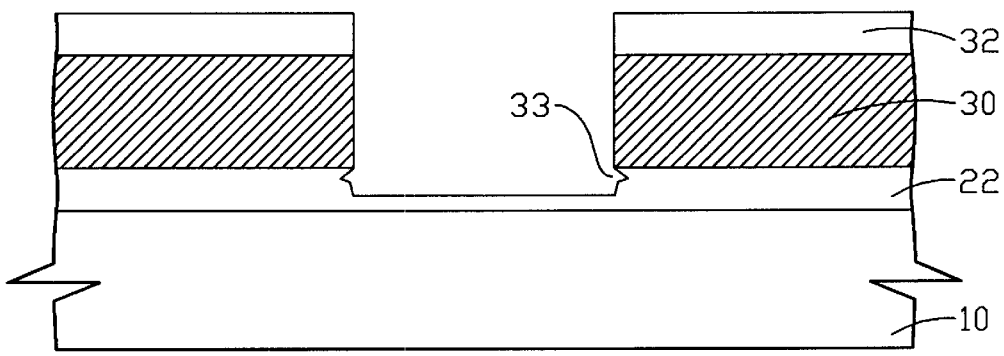
Figure 3A:
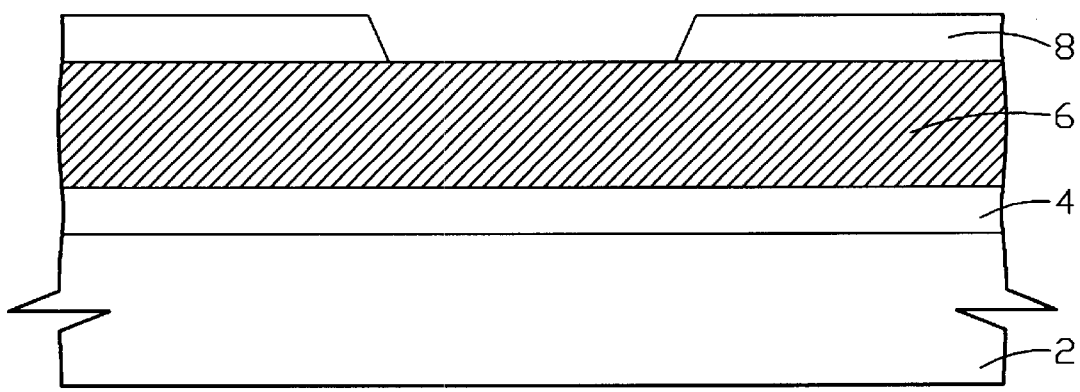
FIGS. 3A to 3C are cross-sectional views illustrating a floating gate fabrication method according to one embodiment of the present invention.

Referring to FIG. 3A, a substrate 2, preferably silicon, is provided with active regions, and passive field regions already defined (not shown) as is well known in the art. A tunnel oxide layer 4 is first formed on the substrate 2. The tunnel oxide 4 can be formed by thermal oxidation process or by an atmospheric or low pressure chemical vapor deposition (LPCVD) process as is well known. Next, a relatively thick polysilicon layer 6 (POLY 1) is formed over the tunnel oxide layer 4 using chemical vapor deposition (CVD) or any other suitable process. The POLY 1 layer formation is followed by formation of an insulating layer 8 over the POLY 1 layer 6. The insulating layer 8 preferably comprises oxide and can be formed by chemical vapor deposition or any other suitable process.

Then, applying conventional masking techniques using either phtoresist patterning or other object aligning to define corresponding patterns for floating gates. The floating gates are etched to form in two consecutive steps wherein each etching step is executed in an associated etch chamber. Etching of the floating gate is typically performed using dry reactive ion etching (RIE). The wafer is first placed into an oxide etch chamber and the first etching step is accomplished using a recipe comprising gases such as $CHF_3/CF_4$ to remove a portion of the insulating layer 8 until the POLY 1 layer 6 exposes off. The etched opening formed in this step can be made taper in shape, as indicated in the figure. Such taper oxide configuration is designed to facilitate the subsequent contact filling for POLY 3 material (for forming erase gates).

Figure 3B:
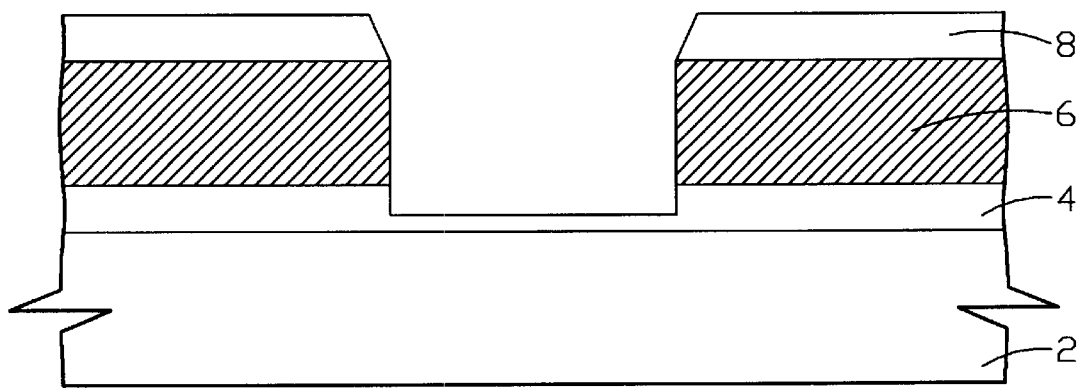

After the first etching step is completed, the wafer is transferred to a poly etch chamber and proceeded with the second step etching. The etching profile formed in the second step etching is preferably vertically shaped. One should noted that the etching steps are preferably formed in an integrated process in which the wafer is not exposed to atmosphere when transferring the wafer from one chamber to another. In the second etching step, etch gas such as $C_2F_6$ is initially supplied into the poly chamber to etch open the polysilicon layer 6. Once the polysilicon etching is completed, the supplying gas to the oxide chamber is switched to an oxide etchant such as $Cl_2$ or HBr to further remove a small portion of oxide from the tunnel oxide layer 4 and form a contact opening as indicated in FIG.3B. Since the removal of the tunnel oxide 6 herein is mainly to provide a secure contact basis for the contact opening, quite minimal portion of oxide is etched away. As a result, very limited time is required for the oxide etching gas to flow around in the poly chamber and, thus, chemical damages to the chamber path would be relatively insignificant. In addition, by performing the polysilicon etching and tunnel oxide etching in the same etch chamber, a much similar etching surrounding is provided for the two etching layers and thus a rather smooth sidewall profile can be attained rather than the perceptible border recess in the conventional three-step procedure. Further, production cost is efficiently cut down by reducing the etching steps (from three steps to two steps) and the chamber transferring procedure.

Figure 3C:
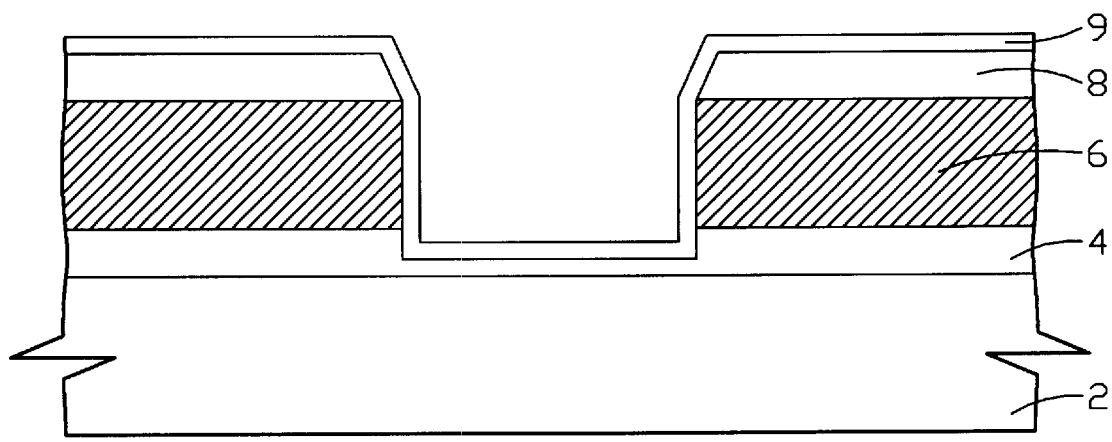

Referring then to FIG. 3C, a protecting oxide layer 9 is formed over the resulting device structure to cover the POLY 1 layer 6 exposed in the patterned contact opening. The protecting oxide layer 9 can be formed by low pressure chemical vapor deposition (LPCVD) or any other suitable process. After depositing the protecting oxide layer 9, nitradation of the surface oxide 9 is performed to strengthen the device structure. In one embodiment, the oxide layer 9 is treated with $N_2/NH_3$ plasma to improve the oxide quality (WAT). Further, rapid thermal annealing (RTA) can then be additionally performed. RTA of the oxide layer 9 is preferably conducted in an $N_2O$ atmosphere. The RTA serves to decrease the defect density of the surface oxide. The RTA also serves to reduce charge trapping in the surface oxide. It is believed that at elevated temperatures, $N_2O$ dissociates into nitrogen gas and reactive atomic oxygen. It is also believed that the reactive atomic oxygen diffuses into the oxide layer repairing oxygen vacancies, thereby reducing the defect density and leakage current.

Although specific embodiments have been illustrated and described, it will be obvious to those skilled in the art that various modifications may be made without departing from what is intended to be limited solely by the appended claims.

What is claimed is:

1. A method for forming a gate structure in a flash memory device, comprising:
   providing a semiconductor substrate having a first insulating layer, a conductive layer and a second insulating layer forming thereon in sequence;
   etching a portion of said second insulating layer to said conductive layer in a first chamber to form a first opening; and
   etching a portion of said conductive layer and a portion of said first insulation layer in a second chamber to deepen said first opening to form a second opening.

2. The method according to claim 1, further comprises depositing a third insulating layer over said semiconductor substrate after forming said second opening.

3. The method according to claim 2, said third insulating layer comprises oxide.

4. The method according to claim 2, further comprises performing a plasma treatment on said third insulating layer.

5. The method according to claim 4, said plasma treatment comprises ammonia/nitrogen plasma treatment.

6. The method according to claim 2, further comprises performing rapid thermal annealing (RTA) after said third insulating layer formation.

7. The method according to claim 1, said conductive layer comprises polysilicon.

8. The method according to claim 1, said first insulating layer comprises oxide.

9. The method according to claim 1, said second insulating layer comprises oxide.

10. The method according to claim 1, said first opening is taper in shape.

11. The method according to claim 1, wherein said second insulating layer comprises an interpoly insulating layer.

12. The method according to claim 1, wherein said semiconductor substrate is not exposed to atmosphere between the two etching steps.

13. A method for forming gate structures in a flash memory device, comprising:
   providing a silicon substrate;
   forming an insulating layer on said silicon substrate;
   forming a polysilicon layer overlying said insulating layer;
   forming an interpoly insulating layer overlying said polysilicon layer to form a stacked structure comprising said insulating layer, said polysilicon layer and said interpoly insulating layer;
   patterning said stacked structure to define a plurality of parallel, spaced-apart strip structures by two dry etching steps, wherein said two dry etching steps comprise a first etching step and a second etching step and said two dry etching steps are performed in two separate chambers; and
   depositing a gate oxide layer over said silicon substrate to insulate said strip structures.

14. The method according to claim 13, further comprises performing a plasma treatment on said gate oxide layer.

15. The method according to claim 14, said plasma treatment comprises ammonia/nitrogen plasma treatment.

16. The method according to claim 13, further comprises performing rapid thermal nitration (RTN) after said gate oxide layer formation.

17. The method according to claim 13, wherein said insulating layer comprises oxide.

18. The method according to claim 13, wherein said interpoly insulating layer comprises oxide.

19. The method according to claim 13, wherein said first etching step etches through said interpoly insulating layer.

20. The method according to claim 19, wherein said interpoly insulating layer is etched to be taper shaped.

21. The method according to claim 13, wherein said second etching step etches through said polysilicon layer and etches away a portion of said insulating layer.

22. A method for forming floating gates in a flash memory cell, comprising:
   forming a tunnel oxide on a substrate;
   forming a polysilicon layer over said tunnel oxide;
   forming an insulating layer comprising oxide over said polysilicon layer;
   etching a portion of said insulating layer to said polysilicon layer in an oxide chamber to form a first opening, said first opening is taper in shape;
   etching a portion of said polysilicon layer and a portion of said tunnel oxide layer in a poly chamber to deepen said first opening in vertical shape to form a second opening;
   forming an oxide protecting layer over said substrate; and
   performing plasma treatments to nitradize said oxide protecting layer.

23. The method according to claim 22, further comprises performing rapid thermal annealing (RTA) after said plasma treatments.

* * * * *